(12) United States Patent
Konstantinov

(10) Patent No.: US 11,476,369 B2
(45) Date of Patent: Oct. 18, 2022

(54) SIC MOSFET WITH BUILT-IN SCHOTTKY DIODE

(71) Applicant: SEMICONDUCTOR COMPONENTS INDUSTRIES, LLC, Phoenix, AZ (US)

(72) Inventor: Andrei Konstantinov, Sollentuna (SE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 168 days.

(21) Appl. No.: 16/949,395

(22) Filed: Oct. 28, 2020

(65) Prior Publication Data

US 2022/0131015 A1 Apr. 28, 2022

(51) Int. Cl.
| | |
|---|---|
| *H01L 29/78* | (2006.01) |
| *H01L 29/872* | (2006.01) |
| *H01L 29/808* | (2006.01) |
| *H01L 29/66* | (2006.01) |
| *H01L 29/80* | (2006.01) |
| *H01L 29/06* | (2006.01) |
| *H01L 29/16* | (2006.01) |
| *H01L 29/10* | (2006.01) |

(52) U.S. Cl.
CPC ...... *H01L 29/8083* (2013.01); *H01L 29/0619* (2013.01); *H01L 29/1095* (2013.01); *H01L 29/1608* (2013.01); *H01L 29/66068* (2013.01); *H01L 29/7806* (2013.01); *H01L 29/806* (2013.01); *H01L 29/872* (2013.01)

(58) Field of Classification Search
CPC ............. H01L 29/1095; H01L 29/7806; H01L 29/872; H01L 29/0619; H01L 29/1608; H01L 29/66068; H01L 29/806; H01L 29/8083

See application file for complete search history.

(56) References Cited

U.S. PATENT DOCUMENTS

| | | | |
|---|---|---|---|
| 10,422,554 B2 | 9/2019 | Herzog et al. | |
| 10,707,340 B2 | 7/2020 | Konstantinov | |
| 10,749,002 B2 | 8/2020 | Domeij | |
| 2016/0005883 A1* | 1/2016 | Yen | ...... H01L 29/7806 257/77 |
| 2017/0250275 A1* | 8/2017 | Yen | ...... H01L 29/0696 |

* cited by examiner

*Primary Examiner* — Eric A. Ward
(74) *Attorney, Agent, or Firm* — Brake Hughes Bellermann LLP

(57) ABSTRACT

A power SiC MOSFET with a built-in Schottky rectifier provides advantages of including a Schottky rectifier, such as avoiding bipolar degradation, while reducing a parasitic capacitive charge and related power losses, as well as system cost. A lateral built-in channel layer may enable lateral spacing of the MOSFET gate oxide from a high electric field at the Schottky contact, while also providing current limiting during short-circuit events.

20 Claims, 9 Drawing Sheets

SIC MOSFET WITH BUILT-IN SCHOTTKY DIODE

TECHNICAL FIELD

This description relates to Silicon Carbide (SiC) semiconductor devices.

BACKGROUND

Silicon carbide (SiC) power metal-oxide-semiconductor field effect transistors (MOSFETs) generally have smaller size and lower power losses compared to, e.g., silicon power devices of similar voltage rating. However, ruggedness and reliability of existing SiC power MOSFETs are generally inferior to silicon MOSFETs, or to silicon insulated-gate bipolar transistors (IGBTs).

Multiple undesirable phenomena impact the reliability and ruggedness of SiC MOSFETs. For example, the high critical field of SiC, although beneficial for reducing power losses, may result in gate oxide instability, especially at elevated operational temperatures, and/or in the presence of hot carriers in the vicinity of the gate oxide. The small size of SiC power MOSFETs also decreases ruggedness in response to a short-circuit event.

Further, SiC MOSFET body diodes may result in bipolar degradation, which stems from material defects and results in device performance degradation. Although it is possible to use an antiparallel SiC Schottky diode to mitigate related effects, such antiparallel Schottky diodes typically also increase a parasitic capacitive charge and related power losses, as well as system cost.

SUMMARY

In the following disclosure, example implementations of an apparatus may include a silicon-carbide (SiC) substrate of a first conductivity type, a drift region of the first conductivity type disposed on the SiC substrate, a vertical metal-oxide-semiconductor field-effect transistor (MOSFET), and a Schottky contact arranged on the Silicon Carbide, and electrically connected to a source region of the MOSFET. A unit cell of the vertical MOSFET may be provided with p-type body regions and an n-type vertical JFET region positioned between each pair of adjacent p-type body regions. The Schottky contact provides a Schottky gate disposed on the n-type vertical JFET region, which Schottky gate also extends laterally at least to some extent over the p-type body regions. The MOSFET source may be formed as an n-type source that may be provided near a center of each p-type body region. Ohmic contacts may be provided to the MOSFET source region and to the p-type body regions. Metal interconnects may be provided to short the p-type body regions and the Schottky contact to the MOSFET source region. A lateral n-type built-in channel layer may be provided that extends from the vertical JFET region towards the MOSFET source region. The lateral n-type built-in channel layer enables protection of a gate oxide of the MOSFET from potential instability caused by high electric fields at the Schottky contact, while also providing current limiting that provides short circuit protection and ruggedness.

According to one general aspect, a Silicon Carbide (SiC) semiconductor device may include an n-type substrate, a drift region disposed on the n-type substrate, a p-type body region disposed on the drift region, a vertical Junction Field Effect Transistor (JFET) region disposed on the drift region, and a Schottky contact disposed over the p-type body region and the vertical JFET region. The SiC semiconductor device may include a Metal Oxide Semiconductor Field Effect Transistor (MOSFET) having a source region electrically connected to the p-type body region and to the Schottky contact, a gate and gate oxide disposed at least partially on the p-type body region, and a drain contact electrically connected to the n-type substrate, and an n-type lateral channel layer at least partially overlapping the gate oxide, the Schottky contact, the p-type body region, and the vertical JFET region, and electrically connecting the MOSFET and the vertical JFET region.

According to another general aspect, a SiC semiconductor device may include a substrate of a first conductivity type, a drift region disposed on the substrate, a junction field effect transistor (JFET) region of the first conductivity type, the JFET region being disposed on the drift region, and a body region of a second conductivity type, the body region being disposed on the drift region and adjacent to the JFET region. The SiC semiconductor device may include a Schottky contact disposed over the JFET region and over a portion of the body region, a lateral channel layer of the first conductivity type, extending laterally over the body region and the JFET region, and partially adjacent to the Schottky contact, and a MOSFET having a source region of the first conductivity type that is electrically connected to the Schottky contact, a drain region of the first conductivity type, a gate, and a gate oxide disposed over the body region, the lateral channel layer, and the source region.

According to another general aspect, a method of making a SiC semiconductor device may include providing a drift region on a SiC substrate of a first conductivity type, providing a body region of a second conductivity type on the drift region, providing a JFET region of the first conductivity type on the drift region and adjacent to the body region, and providing a lateral channel layer of the first conductivity type, extending laterally across the body region and the JFET region. The method may include providing a Schottky contact laterally overlapping an entirety of the JFET region and a portion of the lateral channel layer, and providing a MOSFET having a source region electrically connected to the body region and to the Schottky contact, a gate and gate oxide disposed at least partially on the body region and on the lateral channel layer, and a drain contact electrically connected to the substrate.

The details of one or more implementations are set forth in the accompanying drawings and the description below. Other features will be apparent from the description and drawings, and from the claims.

DETAILED DESCRIPTION

The present disclosure describes a power SiC MOSFET with a built-in Schottky rectifier, which may be referred to herein as a built-in Schottky (BIS) MOSFET. The BIS MOSFET provides advantages of including a Schottky rectifier, such as minimizing or avoiding reliance on a body diode of the BIS MOSFET (and thereby avoiding bipolar degradation), while reducing a parasitic capacitive charge and related power losses, as well as system cost, as compared to conventional SiC power MOSFETS that utilize Schottky rectifiers.

Moreover, a gate oxide of the BIS MOSFET may be protected by laterally spacing the gate oxide from a high electric field that may occur at the Schottky electrode or contact. For example, a lateral built-in channel layer may enable such lateral spacing, while also providing current limiting that protects the BIS MOSFET during short-circuit events.

Thus, the described BIS MOSFET provides both ruggedness and reliability, while also providing superior performance characteristics during power switching, with a small form factor and reduced system cost. Such features are highly desirable in many applications, including, for example, electric motor control.

Figure 1:
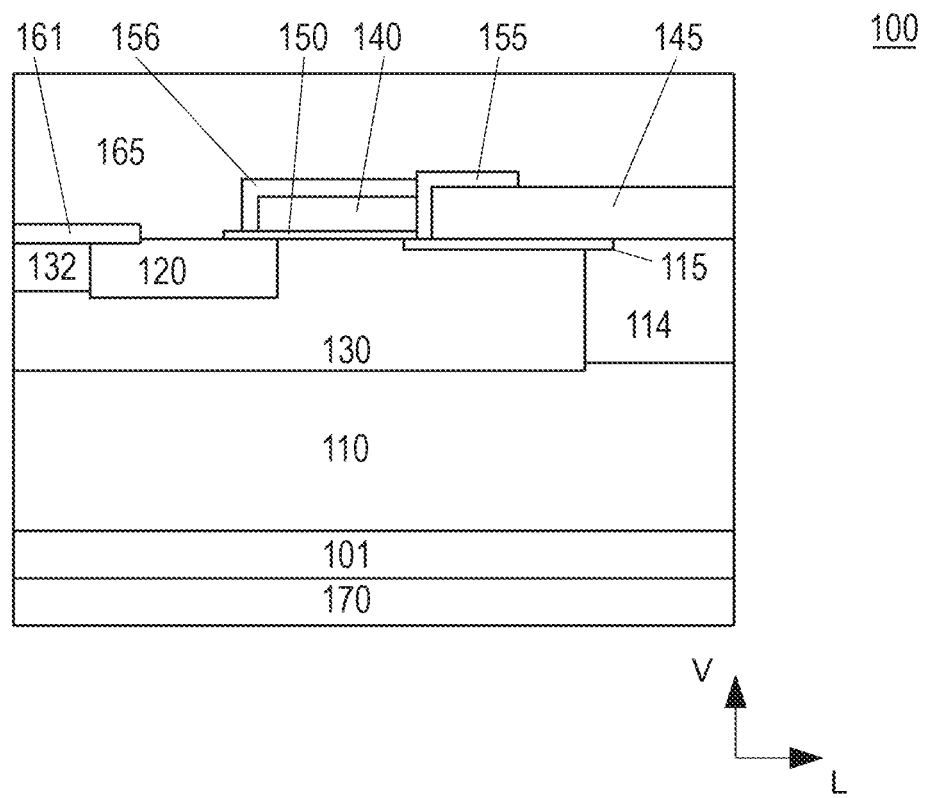
FIG. 1 illustrates a side cross-sectional view of one half of a unit cell of a SiC Built-in Schottky (BIS) MOSFET, according to example implementations.

FIG. 1 is a diagram that schematically illustrates a side cross-sectional view of one half of a unit cell of SiC BIS MOSFET 100 according to example implementations of this disclosure. A full unit cell of the BIS MOSFET 100 is symmetrical, as shown, for example, in the example implementation of FIG. 5.

As shown in FIG. 1, the example BIS MOSFET 100 includes a source terminal 165 and a drain terminal 170. A power SiC MOSFET having the general structure of FIG. 1, in which current may flow between the source terminal 165 and the drain terminal 170, is typically referred to as a vertical MOSFET. In FIG. 1, the illustrated legend indicates that in FIG. 1, and in the following description, the vertical direction V thus refers to an axis that connects, and is perpendicular to, planar surfaces of the source terminal 165 and the drain terminal 170. Thus, a lateral direction L refers to an axis that is perpendicular to the vertical direction (axis) V.

The drain terminal 170 represents a metallic layer, which forms an Ohmic contact to a low-resistivity SiC substrate 101. The substrate 101 may be formed, for example, using a 4H polytype modification of SiC, or other suitable implementation of SiC.

An epitaxial layer 110 is disposed on the substrate 101. At least a portion of the epitaxial layer 110 closer to the substrate 101 represents a drift region, which may be, e.g., low-doped n-type. Thickness and doping values for the layer 110 may be selected to support a desired MOSFET blocking voltage. For example, the drift region thickness may vary between around 4 μm and 100 μm for a blocking voltage of between 600V and 10 kV. Doping may vary, for example, between approximately $3 \times 10^{16}$ and $1 \times 10^{15}$ cm$^{-3}$ for similar voltage ranges.

A vertical junction field effect transistor (JFET) region 114 may be provided with relatively higher donor doping, e.g., between approximately $2 \times 10^{16}$ cm$^3$ and $1 \times 10^{17}$ cm$^{-3}$. As described in detail below, the vertical JFET region 114 may provide a portion of a current channel that may be shared by both a MOSFET and a Schottky rectifier of the BIS MOSFET 100.

A shielding p-body or p-type body region 130 may be provided, e.g., by ion implantation, to block current flow under off-state conditions, as described in more detail, below. Acceptor dose in the p-type body region 130 may be, e.g., above $3 \times 10^{13}$ cm$^{-2}$, which may facilitate prevention of punch-through at high blocking voltages. The p-type body region 130 (and its symmetrical counterpart on an opposed side of the unit cell, not visible in FIG. 1, but shown in FIG. 5) provides a gating function for the vertical JFET region 114 and included current channel therein.

Heavily doped n-type source region 120 and subcontact p++ region 132 are provided in the example of FIG. 1. Both the n-type source region 120 and subcontact p++ region 132 may have a doping level, e.g., of above $1 \times 10^{19}$ cm$^{-3}$.

A shallow, built-in lateral channel layer 115 may be provided with a donor dose, e.g., of between approximately $1 \times 10^{12}$ and $8 \times 10^{12}$ cm$^2$. The shallow built-in lateral channel layer 115 may provide a normally-on portion of a current channel of the BIS MOSFET, although the BIS MOSFET 100 may be normally-off, as described in more detail below with respect to inclusion of a channel stopper region 331 of FIG. 3. That is, the lateral channel layer 115 may be configured to be on under zero-bias conditions, and off at a positive turn-on voltage, of the BIS MOSFET. The lateral spacing of the built-in lateral channel layer 115 enables oxide stability of a gate oxide layer 150, while the lateral JFET channel also provides current-limiting for short-circuit protection (e.g., experiences pinch-off at associated high temperatures).

A Schottky contact 145 in contact with n-type SiC of vertical JFET region 114 may be provided, e.g., by deposition of heavily-doped polysilicon, which may be p-type. An interlayer dielectric isolation layer 155 is provided that separates the Schottky contact 145 from a gate 140 (e.g., a polysilicon gate) and from the gate oxide layer 150, using, e.g., silicon dioxide or silicon nitride.

The gate oxide layer 150 and the polysilicon gate 140 are further provided with an interlayer dielectric 156 between the gate 140 and the source terminal 165. Thus, the gate 140 is provided with the two interlayer dielectrics 155, 156 in FIG. 1, but in other implementations, a single interlayer dielectric may be used to separate the gate 140 from the source terminal 165 and/or the Schottky contact 145 (see, e.g., FIG. 3).

A source contact 161 is provided to form an Ohmic source contact, which also provides Ohmic contact to the p-type body region 130 through the p++ subcontact layer 132. The source contact 165 may be provided using a topside pad metal, which metal is in direct contact to the Ohmic source contact 161, as well as being in contact with the polysilicon Schottky contact 145.

As shown in the example of FIG. 1, the gate oxide 150 may be disposed on the p-type body region 130, at least partially between the source region 120 and the lateral channel layer 115. The gate oxide 150 also overlaps at least a portion of the source region 120 and at least a portion of the lateral channel layer 115. In the example of FIG. 1, the Schottky contact 145 laterally overlaps or is extended over an entirety of the vertical JFET region 114, and the gate 140 and the gate oxide 150 do not overlap laterally the vertical JFET region 114.

In FIG. 1 and other example implementations, the Schottky contact 145 is disposed over an interface between the vertical JFET region 114 and the p-type body region 130.

Put another way, the Schottky contact 145 is extended directly over both the vertical JFET region 114 and at least a portion of the p-type body region 130, so that, e.g., a vertical line or plane extending through a portion of the p-type body region 130 would extend through the Schottky contact 145 as well.

On-state MOSFET operation may thus be provided by application of a positive gate bias exceeding a threshold voltage of the inversion-type MOS channel within the p-type body region 130 between the source region 120 and the lateral channel layer 115. In more detail, such a positive bias opens the path for electron flow sequentially from the source region 120, through the MOS inversion channel, through the lateral channel layer 115, through the vertical JFET region 114, and through the drift region 110 towards the drain terminal 170, as long as positive bias is applied to the drain terminal 170.

When negative bias is applied to the drain terminal 170, while the gate bias is below the threshold voltage, then electron flow proceeds from the drain terminal 170 through the drift region 110, through the n-type vertical JFET region 114 to the Schottky contact 145, which becomes forward-biased. The turn-on voltage of the Schottky diode may be, e.g., approximately between 0.7 V and 1.3 V, depending on the work function of the Schottky barrier. The turn-on voltage of the Schottky diode may thus be significantly below a turn-on voltage of the built-in p-n diode (also referred to as the body diode) formed between the p-type body region 130 and the n-type drift region 110. Minority carrier injection can therefore be avoided, which minimizes or eliminates a risk of bipolar degradation.

Under off-state conditions, both the vertical JFET region 114 and the lateral JFET region of the lateral channel layer 115 may be fully depleted. As a result, any hot carriers generated due to high electric field in the vertical JFET region 114 may only reach the Schottky contact 145, but not the gate oxide 150, because the gate oxide 150 is spaced away from the high-field region, as shown and described. Thus, the possibility for degradation of the oxide-SiC interface due to hot-carrier trapping may be reduced or eliminated, thereby imparting improved reliability.

In example implementations, a portion of the lateral built-in channel layer 115 underneath the Schottky contact 145 effectively forms a metal-semiconductor FET (MESFET) having a grounded gate. Thus, the Schottky contact 145, the lateral channel layer 115, and the p-type body region 130 provide a double-gated structure having characteristics of a lateral JFET with the p-type body region 130 providing a gating effect, and of a MEFSET with the Schottky contact 145 providing a gating function. Providing such a JFET/MEFSFET in series with the MOS-gated inversion channel is beneficial for limiting the peak device current under the conditions of short-circuit at the load, because increases in operation temperature will deplete the lateral channel layer 115 and prevent current flow therethrough.

As a result, even though short-circuits at a load may result in very large power dissipation in a power switch (until the time that the short-circuiting is detected by driver circuitry to turn the positive gate bias off), the BIS MOSFET 100 of FIG. 1 may be protected. For example, in conventional implementations, high power density in SiC devices typically will significantly complicate the protection of power conversion circuits from failure due to short-circuiting at the load, because SiC power MOSFETs may fail too quickly, before the driver circuitry detects the event to turn the switch off. In FIG. 1, however, a built-in current limiter formed by the lateral JFET and/or MESFET in the device just referenced may significantly increase the short-circuit withstand time (SCWT) to ensure safe operation.

In example implementations, a SiC integrated power switch may thus be constructed, integrating a SiC MOSFET and Schottky rectifier. In some implementations, the SiC power switches described herein can be used in high power applications, such as applications with a desired blocking voltage (e.g., off-state conditions of a MOSFET) of, for example, 600 volts (V) or greater. Such SiC MOSFETs are normally off devices, i.e. they have very low leakage current under the conditions of zero bias at the gate electrode.

Figure 5:
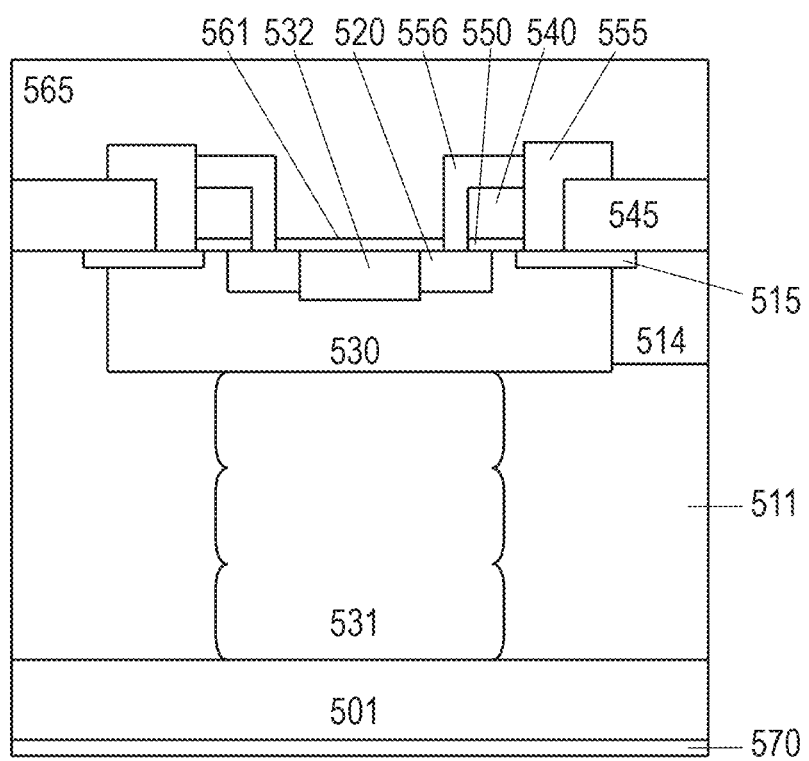
FIG. 5 is a schematic cross-section of a charge-balanced implementation of the BIS MOSFET of FIG. 1, according to example implementations.

In example implementations, power switches described herein can have electrical performance parameters that are near-theoretical performance, e.g., with respect to blocking voltage and on-state resistance. For instance, a theoretical value (limit) for on-state specific resistance ($R_{spon}$) of a vertical non-injection power device (e.g., such as the SiC switches described herein) can be determined based on a resistance of a drift region of the power device, such as a rectifying diode of a SiC power device. For instance, for a non-punch-through power device, $R_{spon}$ can be given by Equation 1:

$$R_{spon} = 4BV^2/(\text{epsilon} * \text{mu} * E_c^3) \qquad \text{Equation 1,}$$

where BV is the breakdown voltage, epsilon is the absolute permittivity of a semiconductor in which the device is formed (e.g., SiC), mu the carrier mobility, and $E_c$ is the critical electric field for avalanche breakdown of the semiconductor. In some implementations, a high-power device can be defined as a device (e.g., a MOSFET or a Schottky rectifier) having a specific resistance, $R_{spon}$, that does not exceed 10 times the theoretical value of $R_{spon}$ given by Equation 1 above. For purposes of this disclosure, $R_{spon}$ can be a differential resistance of an on-state MOSFET multiplied by an active area (e.g., in square centimeters) of the power device, where the active area can be determined by multiplying an active area of a unit cell of the power device by a number of unit cells included in the device. Examples of such unit cells are illustrated in FIG. 5, which are discussed below. It should be understood that differential resistance of a MOSFET is normally defined for the conditions of near-zero drain bias and of desired (rated) on-state positive bias at the MOS-gate electrode. Although the example implementations are described in terms of certain conductivity types (e.g., p-type, n-type), in some implementations, these conductivity types can be reversed.

Figure 2:
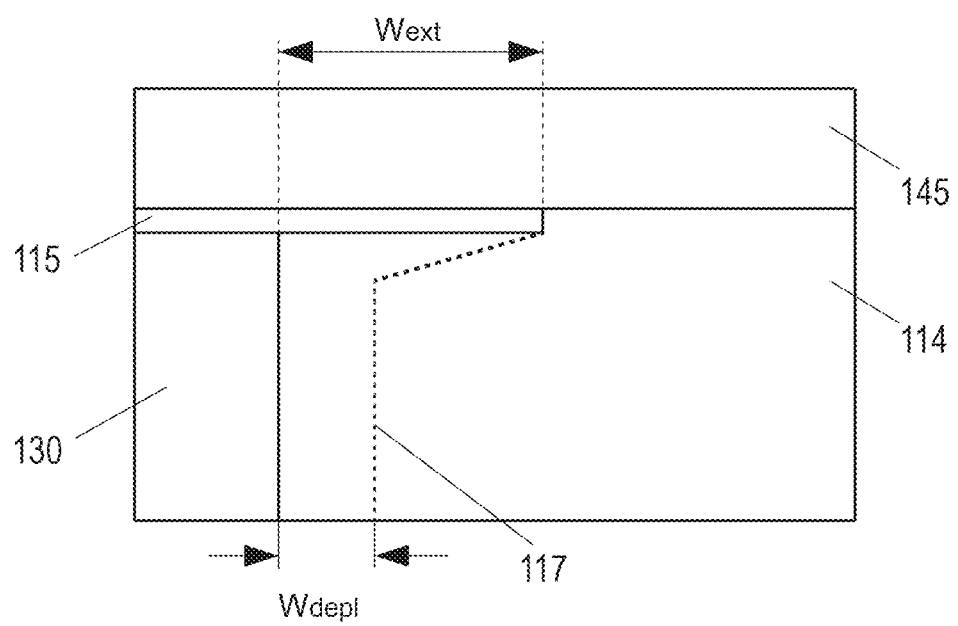
FIG. 2 illustrates a zoomed-in portion of the example implementation of FIG. 1.

FIG. 2 illustrates a zoomed-in portion of FIG. 1. As illustrated, FIG. 2 shows the Schottky contact 145, the lateral channel layer 115, the p-type body region 130, and the vertical JFET region 114.

In example implementations, as already shown and described with respect to FIG. 1 (but not visible in FIG. 2), the lateral channel layer 115 extends in a first direction (in a direction of the source region 120) so as to overlap at least partially the gate 140, which thereby minimizes or avoids the presence of high-resistivity regions in the current path. Example extent of overlap may be selected to exceed a tolerance of feature patterning within the manufacturing process used. Such tolerance may be, e.g., between around 50 nm and a few hundred nm.

As shown in FIG. 2, lateral extension of the lateral channel layer 115 in a second, opposed direction (in a direction of the vertical JFET region 114) may be selected to ensure electron flow to a non-depleted region of the vertical JFET 114. Specifically, dashed line 117 illustrates an example edge of zero-bias depletion region due to the p-n junction between the p-type body region 130 and the vertical JFET region 114. In example implementations, the lateral extension (referred to herein as $W_{ext}$) of the lateral channel layer 115 from the metallurgical p-n junction between the p-type body region 130 and the vertical JFET region 114 at least exceeds the width (referred to herein as $W_{dep1}$) of a zero-bias depletion region. In other example implementations, however, the lateral channel layer 115 may cover an entire width of the vertical JFET region 114, between the vertical JFET region 114 and the Schottky contact 145.

Figure 3:
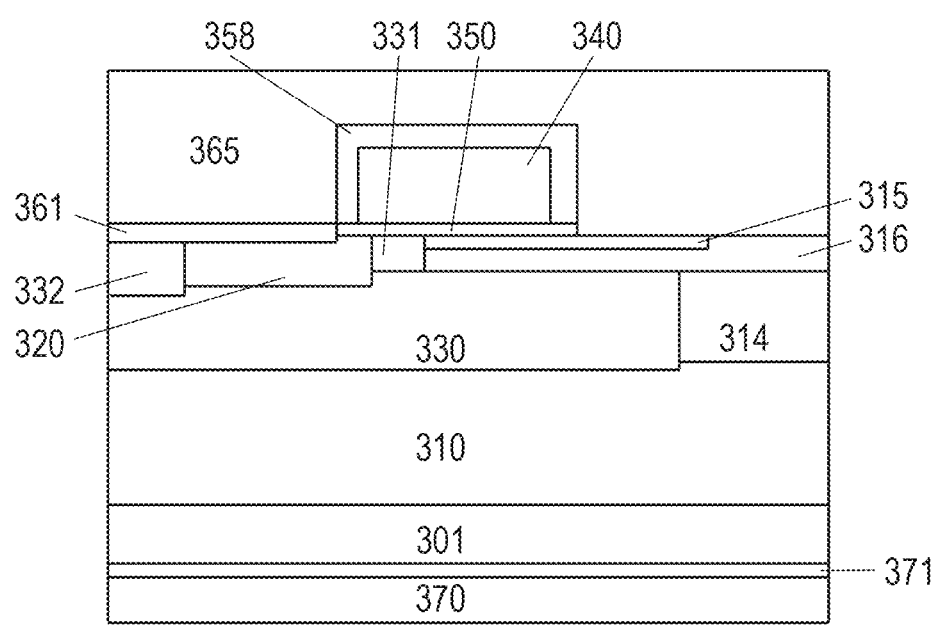
FIG. 3 illustrates an alternate example implementation of the example implementation of the BIS MOSFET of FIG. 1.

FIG. 3 illustrates an alternate example implementation of the example of FIG. 1. As in FIG. 1, FIG. 3 illustrates a side cross-sectional view of one half of a unit cell of the illustrated example implementation.

As described below, and illustrated with respect to the process flow of FIGS. 4A-4I, FIG. 3 illustrates an example in which the BIS MOSFET 300 is formed using epitaxial overgrowth (e.g., an overgrown layer), with a Schottky contact formed using metal deposition (e.g., rather than by polysilicon), e.g., a Schottky contact to SiC directly formed using a topside metal 365.

In more detail, in FIG. 3, BIS MOSFET 300 is formed on a single crystal SiC substrate 301. Similarly to FIG. 1, the BIS MOSFET 300 is provided a drift region 310, a vertical n-JFET region 314, a p-type body region 330, a source region 320 and a p++ subcontact region 332.

In FIG. 3, the lateral channel layer 315 (including lateral JFET channel) and inversion-type MOS channels are formed in a thin, n-type overgrown region 316. An acceptor-doped channel stopper region 331 is provided, e.g., by acceptor ion implantation, to ensure normally-off device operation for the BIS MOSFET 300.

The BIS MOSFET 300 further includes a gate oxide 350, and a gate 340 that is enclosed by an intermetal or interlayer dielectric 358 and by the gate oxide 350. Ohmic source contact 361 forms a contact to the p-type body region 330 through the heavily-doped p-type subcontact region 332. Drain Ohmic contact 371 is connected to the substrate 301, and to a backside metal 370.

A topside metal 365 forms a Schottky contact to n-type SiC overgrown region 316 and to the built-in lateral channel layer 315. The topside metal 365 may be, for example, a stack of Ti, titanium nitride (TiN), and Al. Titanium provides a Schottky barrier to SiC, while TiN provides a diffusion barrier, and Aluminum acts as a pad metal.

Example operations of the BIS MOSFET 300 are similar to the described operations of the BIS MOSFET 100 of FIG. 1. However, in the BIS MOSFET 300 of FIG. 3, during a flow of on-state current, the inversion channel is formed at the boundary of the gate oxide 350 to the channel stopper region 331, as opposed to the boundary of the gate oxide 150 to the p-type body region 130, as is the case with the BIS MOSFET 100.

Example advantages of the described overgrown design relate to a possibility for providing a high acceptor dose of above $1 \times 10^{14}$ cm$^{-2}$ to the p-type body region 330. Providing a high dose of acceptors in this manner is generally beneficial for reverse blocking of the BIS MOSFET 300, including reducing the risk for punch-through and for unwanted turn-on of a parasitic bipolar transistor.

However, high acceptor concentration in the p-type body region 330 adjacent to the MOS inversion channel may decrease inversion-layer mobility. Epitaxial overgrowth of the overgrown region 316 as a spacer layer with a relatively low doping thus improves reverse blocking, without decreasing inversion layer mobility.

FIGS. 4A-4I illustrate an example fabrication sequence for the BIS MOSFET 300 of FIG. 3. Another advantage of BIS MOSFET 300 is higher process flexibility, due, for example, to the use of metallic, rather than polysilicon, Schottky contacts.

Figure 4A:
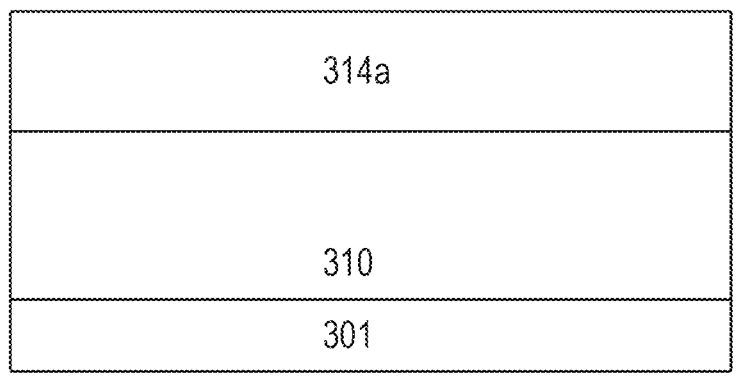
FIGS. 4A-4I illustrate an example fabrication sequence for the BIS MOSFET of FIG. 3.
Figure 4B:
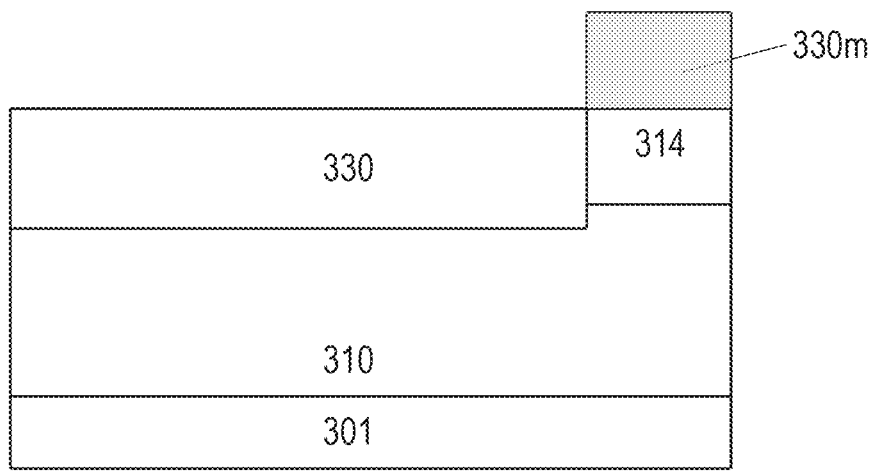
Figure 4C:
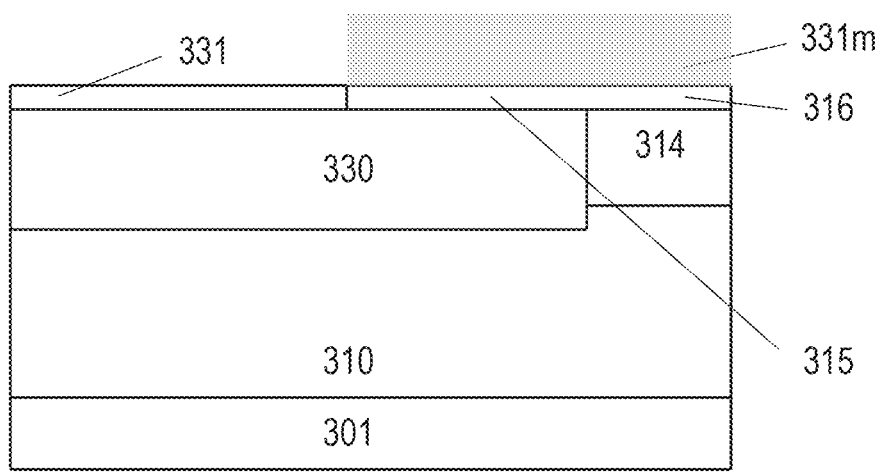

In FIG. 4A, epitaxial drift region layer 310 is formed on substrate 301 with a region 314a of higher n-type doping disposed thereon. In FIG. 4B, an appropriate mask 330m is used to define the p-type body region 330, and acceptor implant is performed, using, e.g., Al acceptor ions. This acceptor implant also defines the vertical n-JFET region 314 in between adjacent p-type body regions 330 (as may be observed with respect to the implementation of FIG. 5). Acceptor dose in the p-type body regions may be, e.g., above $1 \times 10^{14}$ cm$^{-2}$ to minimize the layer conductance, as well as to reduce or exclude the possibility for parasitic bipolar transistor formation in completed BIS MOSFET 300.

The inversion channel region may be formed of very short length utilizing spacer technology. For example, in FIG. 4C, an oxide mask is 331m is patterned, enabling formation of the channel stop region 331 by acceptor ion implantation. The second oxide layer is conformally deposited using chemical vapor deposition, after which an etchback is done using anisotropic plasma etch. This sequence will extend the left-hand boundary of the oxide mask 331m by approximately the thickness of the second deposited layer. A resulting oxide mask can be then used to form the source region 320 by implantation of donor ions, such as, for example, nitrogen, phosphorus, arsenic, or a combination of these ions.

Figure 4D:
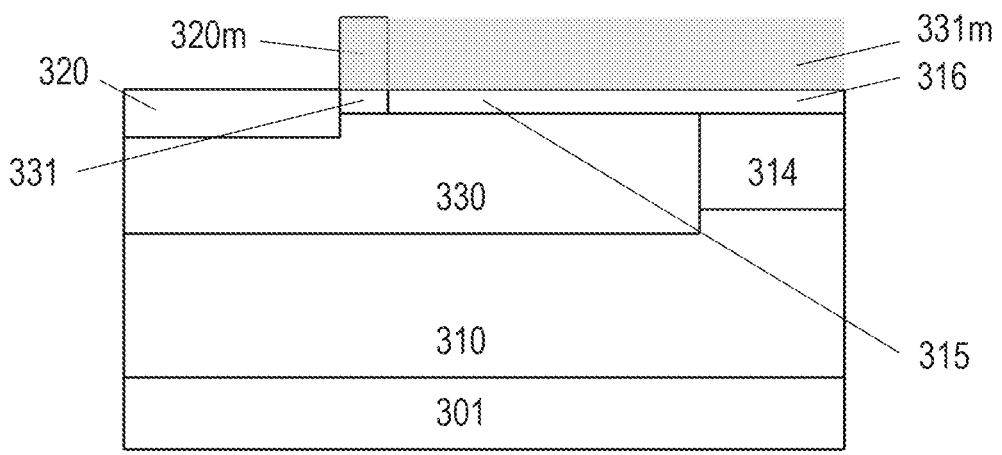

The above-described process is schematically shown in FIG. 4D, which illustrates a wafer cross section after donor ion implantation, but before the oxide mask removal. The additional portion of masking oxide due to the spacer process is shown as region 320m.

Figure 4E:
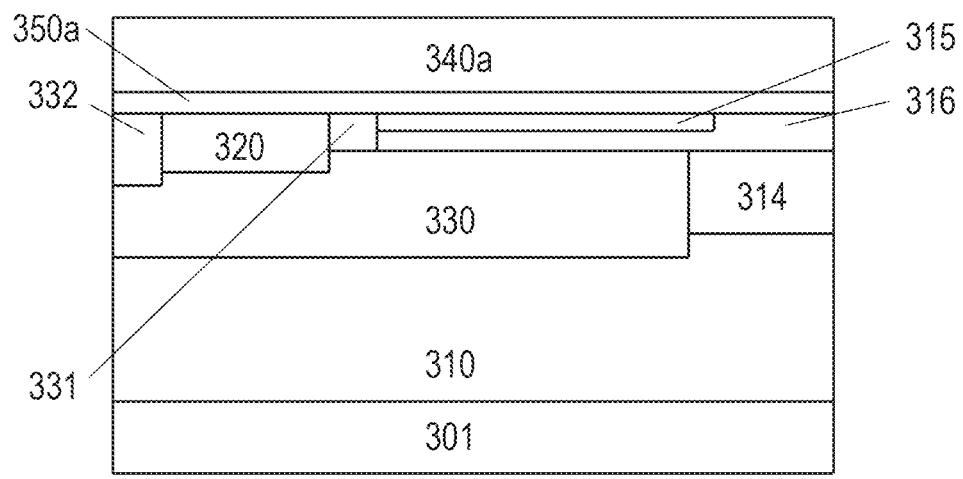

As shown in FIG. 4E, ion implantation may then be continued to make subcontact p++ region 332 and the lateral channel layer 315. Ion implantation of junction termination regions may be also performed at this time.

The SiC wafer may then annealed at a temperature of between around 1550 C and 1800 C to remove ion damage and to activate implanted dopants. As shown further in FIG. 4E, thermal oxide 350a may then be grown and annealed in NO or in $N_2O$ to form an interface of the oxide 350a to SiC. Polysilicon 340a for the gate 340 may thus be deposited, as also shown in FIG. 4E.

Figure 4F:
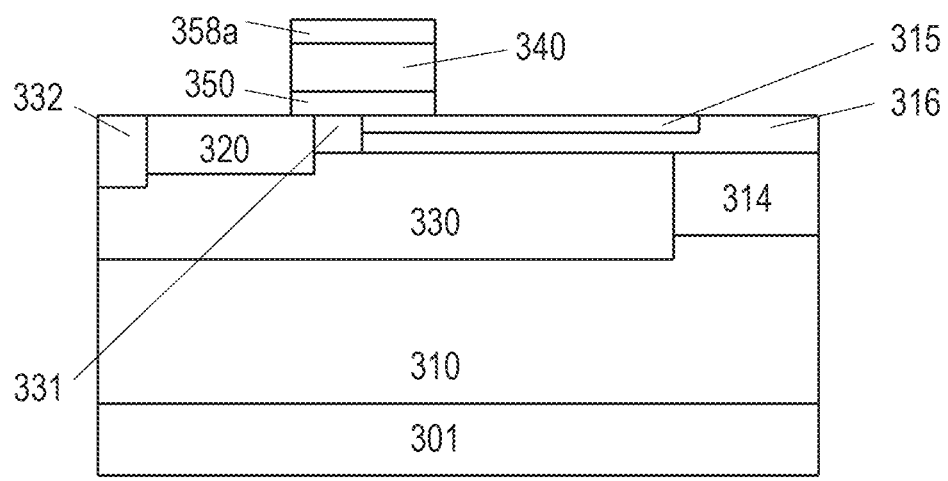

Gate polysilicon deposition may be followed by deposition of the silicon dioxide, which is then patterned to define the gate electrodes. Anisotropic etch may be applied to etch the oxide, after which the oxide 358a is used as a mask for selective etching of polysilicon down to the gate oxide 350, as shown in FIG. 4F.

Figure 4G:
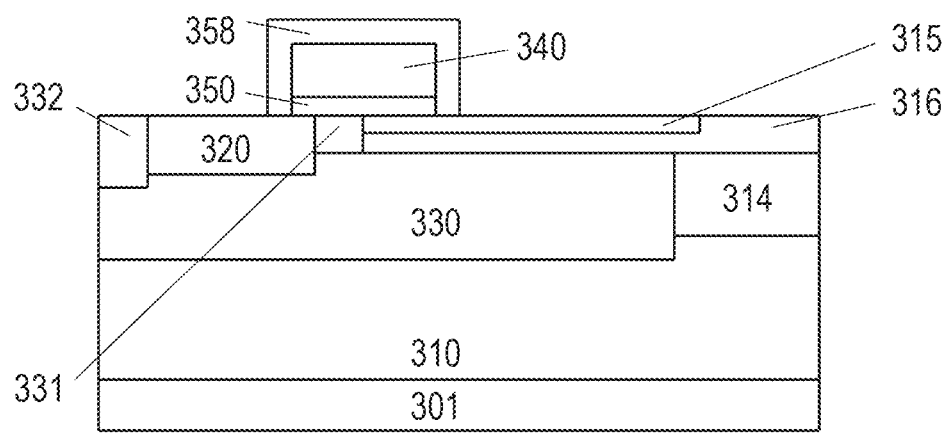

An oxide spacer process may then be applied to form oxide on the sidewalls of polysilicon of the gate 340, so as to complete formation of the interlayer dielectric 358. For example, such a sidewall spacer process may follow the procedure of formation of sidewall oxide regions 320m, which was disclosed above in relation to FIG. 4D. The resulting structure is shown in FIG. 4G.

Figure 4H:
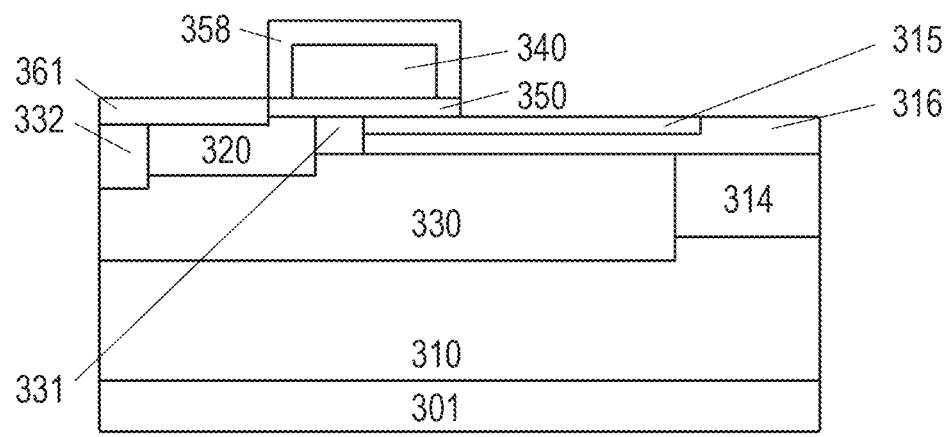

Topside silicide Ohmic contact 361 to the n-source region 320 as well as source grounded subcontact p-type region 332 of the p-body 330 may be formed as shown in FIG. 4H. Specifically, the contact 361 may be formed, for example, by thermal annealing of Ni to form nickel silicide.

Figure 4I:
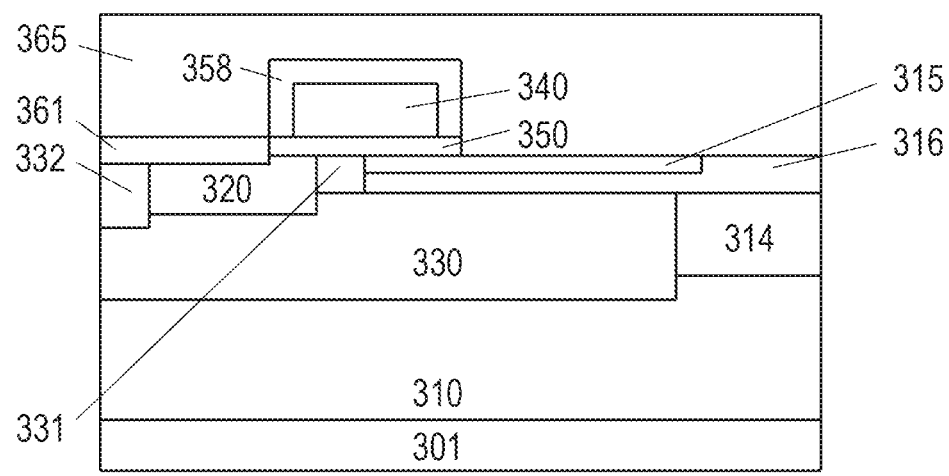

Topside interconnect metal 365 is then deposited and patterned, as is shown in FIG. 4I. The primary role of contact 365 is to provide bonding pads for the MOSFET source region, with a secondary role of providing a Schottky barrier to topside n-type regions, lateral channel layer 315 and overgrown region 316. The topside metal 365 may, for example be a stack of Ti, TiN and Al. The first metal of the stack composing region 365 forms a barrier to SiC with a Schottky barrier with a height of approximately between, e.g., 0.9 eV and 1.5V. In corresponding implementations, this barrier height will provide a turn-on voltage of the Schottky barrier between approximately 0.7V and 1.3V.

Following the operations of FIG. 4I, fabrication of BIS MOSFET 300 as is shown in FIG. 3 may then be finalized by wafer thinning and by forming the backside metallization, layers 371 and 370. Layer 371 is in immediate contact with SiC, and it may therefore form a low-resistivity Ohmic contact with the substrate. The contact 371 may be formed, for example, by pulsed laser anneal of layers of Ni and Ti. The laser anneal forms a nickel silicide contact to SiC, whereas an addition of Ti will prevent excessive generation of free carbon, which may otherwise result from a chemical reaction of SiC with Ni to form nickel silicide. After the pulsed laser anneal the backside solder metal 370 may be deposited. The solder metal may be, for example, a stack of Ti, Ni and Ag.

FIG. 5 illustrates a further example implementation in which a BIS MOSFET 500 is provided with a charge-balanced drift region. The charge-balanced drift region may be composed of an array of p-type and n-type pillars, also referred to as p-type bodies and n-type bodies, as described in detail, below.

In FIG. 5, the BIS MOSFET 500 shares many features with the BIS MOSFET 100, so that, in FIG. 5, regions 501, 514, 515, 520, 530, 532, 540, 545, 555, 556, 561, 565, and 570 correspond respectively to regions 101, 114, 115, 120, 130, 132, 140, 145, 155, 156, 161, 165, and 170 in the BIS MOSFET 100 of FIG. 1. In FIG. 5, however, the n-type drift region 110 is replaced with charge-balanced n-pillar 511 and p-pillar 531.

More specifically, a charge balance of acceptors in the p-pillar 531 and of the donors in the n-pillar 511 may be understood to mean that the total charges of non-compensated acceptors and donors in respective p-type and n-type regions are substantially close in number. To further quantify a nature of the charge balancing between the p-pillar 531 and n-pillar 511, an average lateral donor charge $Q_d$ of non-compensated donors in the charge balanced the n-pillar 511 may be defined as a total amount of non-compensated donors in the n-pillar 511, divided by the unit cell area ($S_{cell}$). Similarly, acceptor charge $Q_a$ may be defined as a number of non-compensated acceptors in the p-pillar 531, divided by the unit cell area. Then, in example implementations, donor charge $Q_d$ and acceptor charge $Q_a$ may have a deviation (e.g., a charge imbalance) of no more than around $1\times10^{13}$ cm$^{-2}$, which may be expressed as $[(Q_a-Q_d)/S_{cell}]<1\times10^{13}$ cm$^{-2}$. In some implementations, an unbalance in mean electric charge of p-type and n-type bodies of over approximately $1\times10^{13}$ cm$^{-2}$ might result in electric field concentration and in low blocking voltage as a result.

Figure 6A:
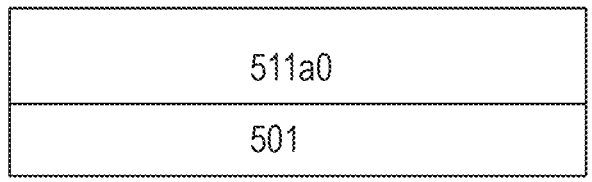
FIGS. 6A-6H illustrate operations for forming the BIS MOSFET of FIG. 5, according to example implementations.
Figure 6B:
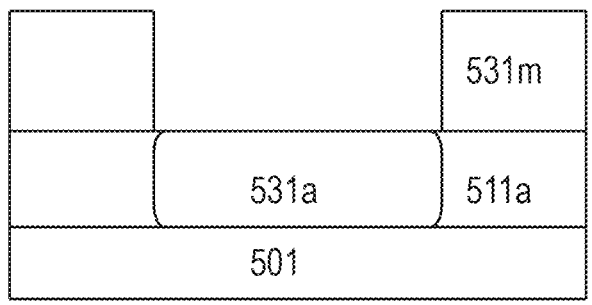

Example fabrication techniques for making a charge-balanced BIS MOSFET 500 of FIG. 5 may require one or more cycles of epitaxial regrowth and ion implantation in order to form the n-pillar and p-pillar, i.e., n-pillar 511 and the p-pillar 531. Specifically, as shown in FIG. 6A, such fabrication may start from epitaxial growth of an n-type SiC layer 511a0 on a low-resistivity n-type substrate 501. After epitaxy, the resulting SiC wafer of FIG. 6A may be blanket-implanted with donor ions so as to provide desired doping to a portion 511a, as shown in FIG. 6B, which will form a lower portion of the n-pillar 511. N-type doping of the n-body portion 511a may be alternately provided in the course of epitaxy. However, the precision of epitaxial doping is generally much lower that of ion implantation, which might result in in excessive charge imbalance between the n-pillar 511 and the p-pillar 531. As further shown in FIG. 6B, acceptor ions may then be implanted using a suitable mask 531m. The masking layer 531m is then etched away.

Figure 6C:
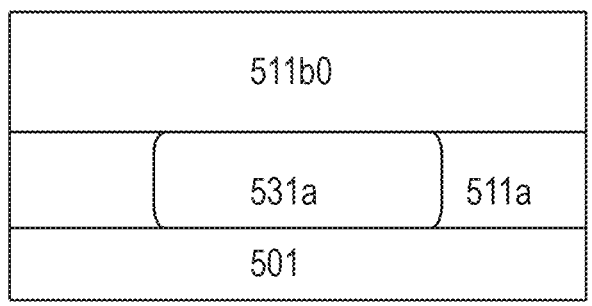
Figure 6D:
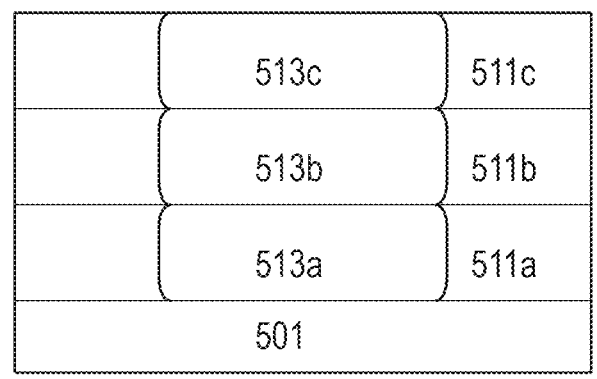

In FIG. 6C, epitaxial regrowth of layer 511b0 is then applied to form the template of a middle portion of n-pillar 511. Ion implants, such as already described above with respect to FIGS. 6A and 6B, may be performed again. Then, FIG. 6D illustrates that the cycles of epitaxial regrowth and ion implantation may be iterated so as to form all of the drift region 510 with n-pillar 511 and p-pillar 531. Specifically, in FIG. 6D, the n-pillar 511 and p-pillar 531 are schematically separated in respective sections 511a, 511b, and 511c, and 513a, 513b, and 513c, in order to schematically separate the portions originating from three separate epitaxial runs.

Figure 6E:
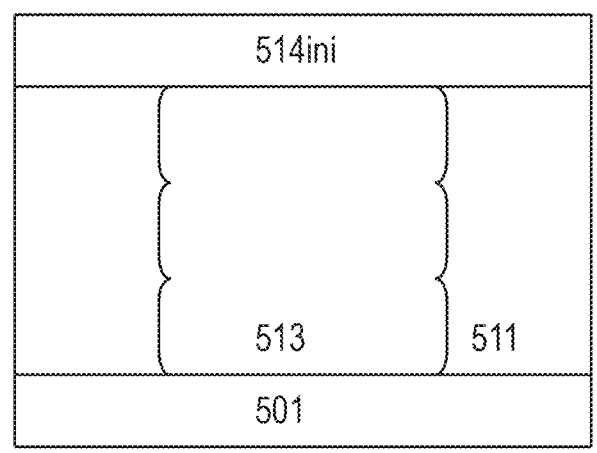
Figure 6F:
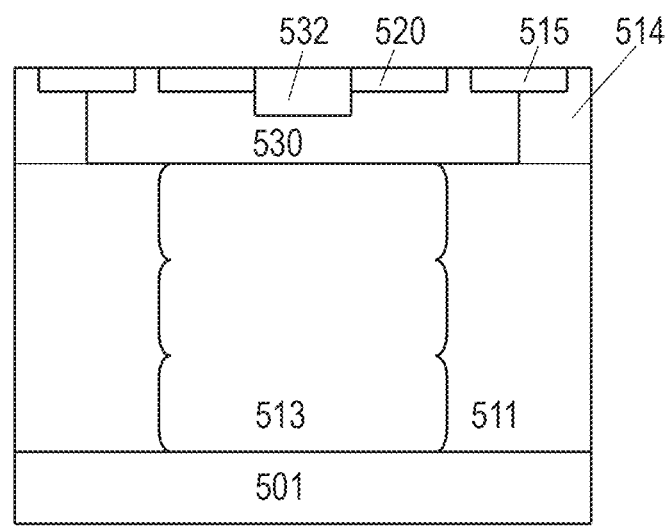

Then, in FIG. 6E, the drift region that includes the n-pillar 511 and the p-pillar 531 is then further overgrown by a capping layer 514ini. In FIG. 6F, masked ion implants of acceptor ions may then be performed to define the p-type body region 530 and subcontact region 532. In FIG. 6f, the implant of p-type body region 530 will also define the vertical JFET region 514. Masked donor ions implants are performed to define built-in lateral channel layer 515 and the source region 520, after which implanted impurities may be activated by a high-temperature anneal.

Figure 6G:
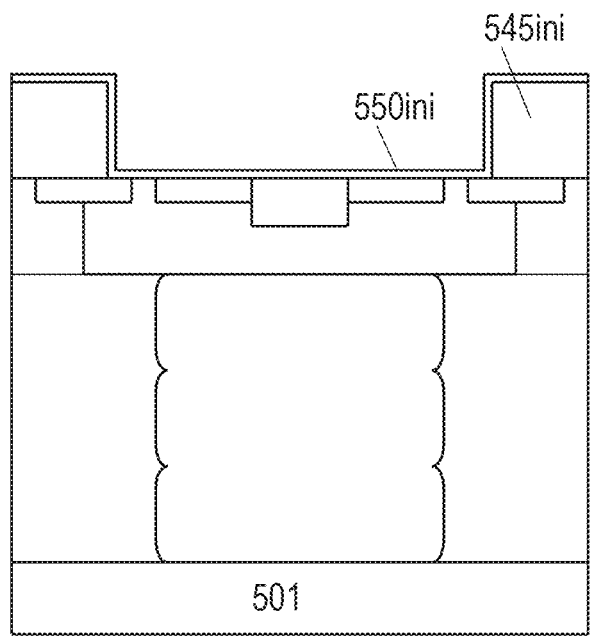
Figure 6H:
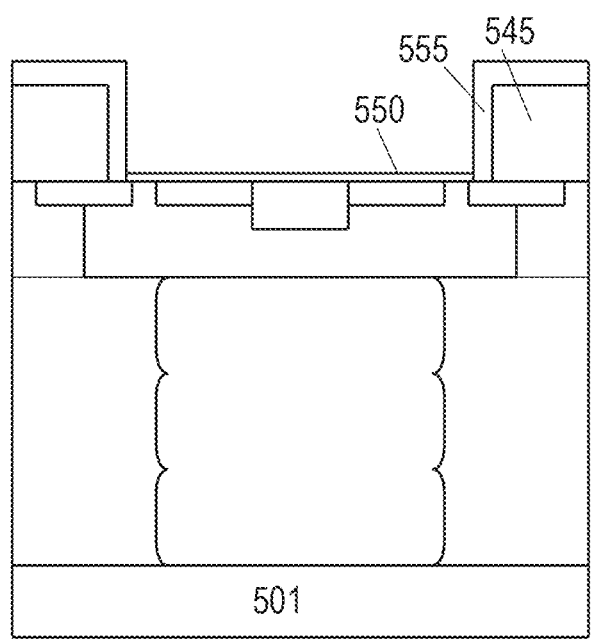

In FIG. 6G, polysilicon Schottky contact is then deposited and patterned to define Schottky contact 545ini, after which a layer of oxide 550ini is deposited by CVD or by atomic layer deposition (ALD). In FIG. 6H, thermal oxidation may then be applied to form interlayer dielectric (ILD) 555 on top of the polysilicon Schottky contact 545, which process may also increase a resulting thickness of the gate oxide 550.

The oxide layer 555 formed on top of the polysilicon Schottky contact 545 may be much thicker than the gate oxide 550, because an oxidation rate of polysilicon is much higher than an oxidation rate of SiC. Thus, deposited oxide 550ini prevents full oxidation of the polysilicon Schottky contact 545 before a required thickness of gate oxide 550 is obtained. Further stages to finalize processing charge-balanced BIS MOSFET 500 may be implemented, for example, using standard techniques. Further, it will be appreciated that the BIS MOSFET 100 of FIG. 1 may be fabricated using the techniques of FIGS. 6A-6H, but omitting the charge-balanced n-pillar 511 and p-pillar 531.

As described and referenced above, conventional SiC MOSFETs have high power, and are vulnerable to short-circuit events at the load. In specific examples, short-circuit withstand times may go down to below 1-2 microseconds for $V_d$ of 67% of rated voltage or higher, which, for example, makes protection for motor drives extremely problematic. Further, SiC MOSFETs are vulnerable to bipolar degradation and to oxide interface instability during turn-on of the a pn body diode. Although this problem may be mitigated by co-packaging with antiparallel Schottky diode, conventional approaches to including a Schottky diode result in power losses and increases in system cost. Moreover, attempting to integrate conventional SiC MOSFETS and Schottky diodes may result in gate oxide instability due to high fields at the Schottky barrier, and associated repeated occurrences of avalanche stress.

In example implementations herein, however, a high voltage (HV) SiC MOSFET has is provided with a lateral inversion channel formed by an active MOSFET gate at an interface of a gate oxide to a p-body. A Schottky gate is formed on top of a vertical JFET channel region, and on top of a shallow lateral n-type channel. The Schottky gate 145 may be polysilicon or refractory Molybdenum silicide (MoSi), and may be grounded to the source of the MOSFET. The lateral channel layer may be normally on and may electrically connect the inversion channel of the MOSFET to the vertical JFET region. The channel layer 115 may be passively gated by the Schottky gate.

The resulting BIS MOSFET combines the functions of a HV SiC MOSFET and of HV SiC Schottky diodes, e.g., providing 3rd quadrant rectification without minority carrier injection. Gate instability issues may thus be resolved without using an external Schottky diode, resulting in significant cost saving and chip count decreases.

Moreover, the passively gated lateral JFET may have abrupt saturation, and a rapid decrease of the saturation current with the junction temperature. This minimizes power dissipation in a short-circuit event, so that sustainable short-circuit time is significantly increased. The rugged FET device can be safely used for industrial electric motor control, unlike standard SiC MOSFETs, which all have very problematic SCWT (short-circuit withstand time).

More particularly, a shallow-channel JFET limiter as included herein shows much more abrupt saturation and decrease of staturation current with junction temperature, unlike standard SiC MOSFET devices, for which the drain current increases under high temperature conditions. In the combined MOSFET/lateral JFET device as described herein, an absolute values of a threshold voltage of the JFET limiter may be below the on-state bias of the MOS-gate.

Better conductance of the lateral JFET may be provided due to bulk electron mobility thereof, which is much higher than the inversion-channel electron mobility of the MOSFET. The current limitation level of the lateral JFET may be set to ensure passing a maximum desired onstate drain current of the MOSFET at the highest operation temperature (e.g., 175 C).

Still further, the rugged SiC FET is as immune to repeated avalanche events as a SiC Schottky rectifier, since access of avalanche plasma to the MOS gate is fully blocked. The rugged FET has lower feedback capacitance than a standard SiC MOSFET, and lower turn-on loss as a result. Thus, the described approaches resolve multiple reliability issues, which are otherwise limiting of applications of SiC MOSFETs in high-power conversion systems, due to failure risks.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A Silicon Carbide (SiC) semiconductor device, comprising:
    an n-type substrate;
    a drift region disposed on the n-type substrate;
    a p-type body region disposed on the drift region;
    a vertical Junction Field Effect Transistor (JFET) region disposed on the drift region;
    a Schottky contact disposed over the p-type body region and the vertical JFET region;
    a Metal Oxide Semiconductor Field Effect Transistor (MOSFET) having a source region electrically connected to the p-type body region and to the Schottky contact, a gate and gate oxide disposed at least partially on the p-type body region, and a drain contact electrically connected to the n-type substrate; and
    an n-type lateral channel layer at least partially overlapping the gate oxide, the Schottky contact, the p-type body region, and the vertical JFET region, and electrically connecting the MOSFET and the vertical JFET region.

2. The SiC semiconductor device of claim 1, wherein the n-type lateral channel layer is normally-on.

3. The SiC semiconductor device of claim 1, wherein an extent of lateral extension of the n-type lateral channel layer in overlapping the vertical JFET region exceeds a width of a zero-bias depletion region of the vertical JFET region and enables electron flow to a non-depleted region of the vertical JFET region.

4. The SiC semiconductor device of claim 1, wherein the n-type lateral channel layer entirely overlaps the vertical JFET region.

5. The SiC semiconductor device of claim 1, wherein, during a flow of on-state current of the MOSFET, an inversion channel of the MOSFET is formed at a boundary of the gate oxide to the p-type body region.

6. The SiC semiconductor device of claim 1, wherein the n-type lateral channel layer extends between the vertical JFET region and the source region of the MOSFET.

7. The SiC semiconductor device of claim 1, further comprising:
an overgrown region extending laterally between the p-type body region and the vertical JFET region, and including the n-type lateral channel layer therein.

8. The SiC semiconductor device of claim 7, further comprising:
a p-type channel stopper region disposed between the n-type lateral channel layer and the source region of the MOSFET,
wherein, during a flow of on-state current of the MOSFET, an inversion channel of the MOSFET is formed at a boundary of the gate oxide and the channel stopper region.

9. The SiC semiconductor device of claim 1, wherein the Schottky contact extends laterally over the p-type body region.

10. The SiC semiconductor device of claim 1, wherein the gate and the gate oxide are laterally spaced from, and do not overlap, the vertical JFET region.

11. The SiC semiconductor device of claim 1, wherein a charge-balanced p-pillar and n-pillar are disposed within the drift region.

12. The SiC semiconductor device of claim 1, further comprising an interlayer dielectric disposed between the gate and the Schottky contact.

13. The SiC semiconductor device of claim 1, wherein the lateral channel layer provides a lateral JFET channel in series with the MOSFET that provides current-limiting during a short-circuit event.

14. A SiC semiconductor device, comprising:
a substrate of a first conductivity type;
a drift region disposed on the substrate;
a junction field effect transistor (JFET) region of the first conductivity type, the JFET region being disposed on the drift region;
a body region of a second conductivity type, the body region being disposed on the drift region and adjacent to the JFET region;
a Schottky contact disposed over the JFET region and over a portion of the body region;
a lateral channel layer of the first conductivity type, extending laterally over the body region and the JFET region, and partially adjacent to the Schottky contact; and
a MOSFET having a source region of the first conductivity type that is electrically connected to the Schottky contact, a drain region of the first conductivity type, a gate, and a gate oxide disposed over the body region, the lateral channel layer, and the source region.

15. The SiC semiconductor device of claim 14, wherein the lateral channel layer is configured to be on under zero-bias conditions, and off at a positive turn-on voltage, of the MOSFET.

16. The SiC semiconductor device of claim 14, wherein the Schottky contact extends laterally over an entirety of the JFET region.

17. The SiC semiconductor device of claim 14, wherein the lateral channel layer provides current-limiting during a short-circuit event at a load of the SiC semiconductor device.

18. The SiC semiconductor device of claim 14, wherein the gate and the gate oxide are laterally spaced from, and do not overlap, the JFET region.

19. A method of making a SiC semiconductor device, the method comprising:
providing a drift region on a SiC substrate of a first conductivity type;
providing a body region of a second conductivity type on the drift region;
providing a JFET region of the first conductivity type on the drift region and adjacent to the body region;
providing a lateral channel layer of the first conductivity type, extending laterally across the body region and the JFET region;
providing a Schottky contact laterally overlapping an entirety of the JFET region and a portion of the lateral channel layer; and
providing a MOSFET having a source region electrically connected to the body region and to the Schottky contact, a gate and gate oxide disposed at least partially on the body region and on the lateral channel layer, and a drain contact electrically connected to the substrate.

20. The method of claim 19, further comprising doping the lateral channel layer with dopants of the first conductivity type to cause the lateral channel layer to be normally-on.

* * * * *